United States Patent
England et al.

(10) Patent No.: US 10,026,883 B2
(45) Date of Patent: Jul. 17, 2018

(54) WAFER BOND INTERCONNECT STRUCTURES

(71) Applicant: GLOBALFOUNDRIES INC., Grand Cayman (KY)

(72) Inventors: Luke England, Saratoga Springs, NY (US); Rahul Agarwal, Waterford, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 11 days.

(21) Appl. No.: 15/385,068

(22) Filed: Dec. 20, 2016

(65) Prior Publication Data

US 2018/0175266 A1    Jun. 21, 2018

(51) Int. Cl.
| | |
|---|---|
| H01L 33/62 | (2010.01) |
| H01L 23/00 | (2006.01) |
| H01L 25/16 | (2006.01) |
| H01L 33/30 | (2010.01) |
| H01L 33/32 | (2010.01) |
| H01L 33/28 | (2010.01) |
| F21V 19/00 | (2006.01) |
| F21Y 115/10 | (2016.01) |

(52) U.S. Cl.
CPC .............. *H01L 33/62* (2013.01); *H01L 24/80* (2013.01); *H01L 25/167* (2013.01); *H01L 33/28* (2013.01); *H01L 33/30* (2013.01); *H01L 33/32* (2013.01); *F21V 19/005* (2013.01); *F21Y 2115/10* (2016.08); *H01L 2224/80896* (2013.01)

(58) Field of Classification Search
CPC ......... H01L 33/28; H01L 33/30; H01L 33/32; H01L 33/62; H01L 24/80; H01L 25/167
See application file for complete search history.

(56) References Cited

U.S. PATENT DOCUMENTS

| | | | |
|---|---|---|---|
| 7,592,970 B2 * | 9/2009 | Matthies | G02F 1/13336 345/1.1 |
| 2005/0078104 A1* | 4/2005 | Matthies | G02F 1/13336 345/204 |
| 2007/0117253 A1* | 5/2007 | Hsu | H01L 27/14618 438/75 |
| 2015/0130692 A1* | 5/2015 | Cooke | G06F 1/26 345/88 |

\* cited by examiner

*Primary Examiner* — Christine Enad
(74) *Attorney, Agent, or Firm* — Anthony Canale; Andrew M. Calderon; Roberts Mlotkowski Safran Cole & Calderon, P.C.

(57) ABSTRACT

The present disclosure relates to semiconductor structures and, more particularly, to wafer bond interconnect structures and methods of manufacture. The structure includes: a plurality of sub-pixels each comprising a contact plate; and redundant connections at opposite corners of each sub-pixel on a backside of the contact plate.

20 Claims, 3 Drawing Sheets

WAFER BOND INTERCONNECT STRUCTURES

FIELD OF THE INVENTION

The present disclosure relates to semiconductor structures and, more particularly, to wafer bond interconnect structures and methods of manufacture.

BACKGROUND

Inorganic light emitting diodes (ILED) are light emitting diodes made from semiconductor material. It is possible to produce a variety of different colors using an ILED including red, green, yellow and blue. In operation, the ILED emits light when a forward bias voltage is applied to a P-N junction of the semiconductor material.

4k ILED display systems are composed of an LED die stacked on a control die. The 4K ILED display requires 64 mil interconnects between dies at sub-5 μm pitch. Individual interconnects are required per sub-pixel in the 4k display pixel array. However, high interconnect yields at these dimensions is difficult to obtain.

SUMMARY

In an aspect of the disclosure, a structure comprises: a plurality of sub-pixels each comprising a contact plate; and redundant connections at opposite corners of each sub-pixel on a backside of the contact plate.

In an aspect of the disclosure, a pixel structure comprises: a plurality of sub-pixels each comprising a contact plate; and bond pad structures at two opposing corners on a backside of the contact plate which intersect a diagonal line "d" extending between the two opposing corners of each sub-pixel.

In an aspect of the disclosure, a method comprises: forming bond pad structures at two opposing corners on a backside of a contact plate of a plurality of sub-pixels, the bond pad structures intersecting a diagonal line "d" extending between the two opposing corners of each sub-pixel.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to wafer interconnect structures and methods of manufacture. More specifically, the present disclosure relates to a layout pattern of wafer bond pad structures for an inorganic light emitting diode (ILED) and methods of manufacture. In embodiments, the layout pattern can also be applicable for any repeatable design structure such as memory cell arrays, etc. Advantageously, the wafer bond pad structures, e.g., interconnect structures, are provided in a specific layout pattern which provides interconnect redundancy while maintaining large pitch required for high yielding bonds. Moreover, by implementing the layout pattern described herein, the bond pad pattern can be repeated across an entire wafer for uniform pixel pitches, while also being scaled with pixel size and bonding technology improvements.

In embodiments, the wafer bond pad structures are provided in a specific interconnect layout where two redundant bond pads (e.g., interconnects) are designed per sub-pixel, with redundant connections residing at opposite corners of a backside of the sub-pixel contact plate. Also, the specific layout pattern will not violate minimum manufacturability pitch rules between sub-pixels, while also maximizing oxide surface area for wafer bonding techniques.

The wafer bond pad structures of the present disclosure can be manufactured in a number of ways using a number of different tools. In general, though, the methodologies and tools are used to form structures with dimensions in the micrometer and nanometer scale. The methodologies, i.e., technologies, employed to manufacture the wafer bond pad structures of the present disclosure have been adopted from integrated circuit (IC) technology. For example, the structures are built on wafers and are realized in films of material patterned by photolithographic processes on the top of a wafer. In particular, the fabrication of the wafer bond pad structures uses three basic building blocks: (i) deposition of thin films of material on a substrate, (ii) applying a patterned mask on top of the films by photolithographic imaging, and (iii) etching the films selectively to the mask.

Figure 1:
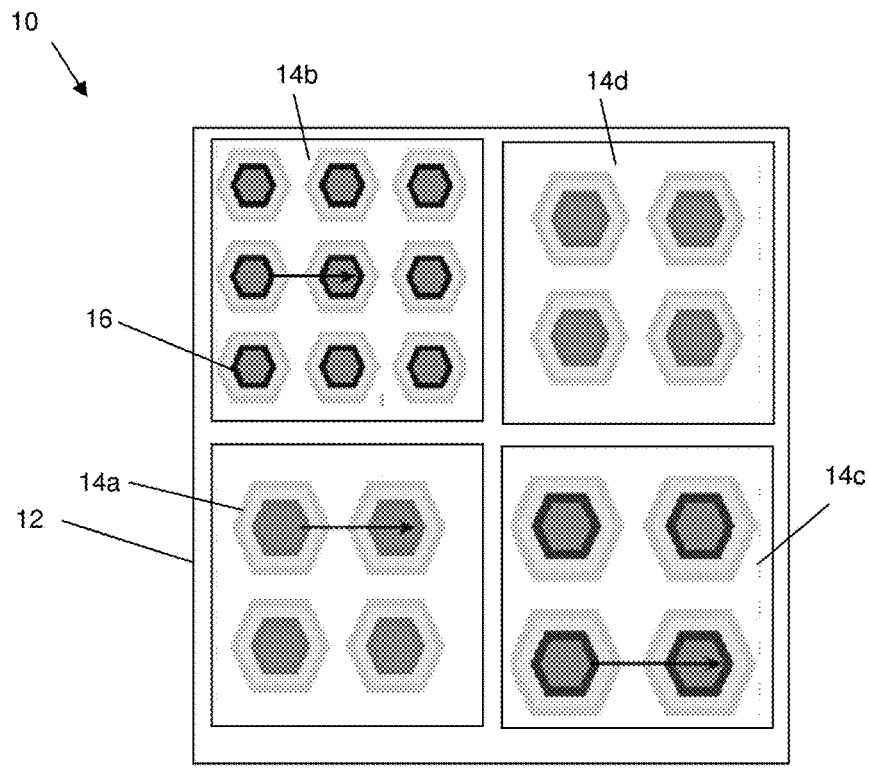
FIG. 1 shows a pixel design in accordance with aspects of the present disclosure.

FIG. 1 shows a pixel design in accordance with aspects of the present disclosure. It should be understood by those of skill in the art that FIG. 1 (and other figures described herein) can also represent a layout pattern for any repeatable design structure such as memory cell arrays, etc. In FIG. 1 a pixel 10 comprises a contact plate or electrode 12 with four sub-pixels 14a-14d. In embodiments, the contact plate or electrode 12 can be a nano-wire contact and reflector plate composed of opaque material such as metal, for example, to maximize light emitting from the sub-pixels 14a-14d. In embodiments, the pixel 10 has a dimension of 6.35 μm×6.35 μm and the sub-pixels 14a-14d have a dimension of 3.175 μm×3.175 μm; although other dimensions are also contemplated herein.

Still referring to FIG. 1, the sub-pixels 14a-14d comprise in one illustrative example, a RGB pixel design used in an inorganic light emitting diode (ILED). For example, each of the sub-pixels 14a-14d can have a different number of nano-wires 16 composed of different materials to emit a certain color, e.g., wavelength. By way of non-limiting example, (i) for green light, there can be four nano-wires 16 for sub-pixels 14a, 14d, (ii) for blue light, there can be nine nano-wires 16 for sub-pixel 14b, and (iii) for red light, there can be four nano-wires 16 for sub-pixel 14c. Although sub-pixel 14d is shown to be redundant to sub-pixel 14a, it should be understood that sub-pixel 14d can be redundant to any of the sub-pixels 14a-14c. Alternatively, sub-pixel 14d can be left empty, e.g., devoid of any nano-wires.

Although not important to the understanding of the present disclosure, the nano-wires 16 can be composed of different materials in order to provide different wavelengths.

For example, Table 1 below shows exemplary combinations of semiconductor materials that can be utilized for the nano-wires.

TABLE 1

| Color | Wavelength | Semiconductor Material |
|---|---|---|
| RED | $610 < \lambda < 760$ | Aluminum gallium arsenide (AlGaAs) |
|  |  | Gallium arsenide phosphide (GaAsP) |
|  |  | Aluminum gallium indium phosphide (AlGaInP) |
|  |  | Gallium(III) phosphide (GaP) |
| GREEN | $500 < \lambda < 570$ | Gallium(III) phosphide (GaP) |
|  |  | Aluminum gallium indium phosphide (AlGaInP) |
|  |  | Aluminum gallium phosphide (AlGaP) |
|  |  | Indium gallium nitride (InGaN)/Gallium(III) nitride (GaN) |
| BLUE | $450 < \lambda < 500$ | Zinc selenide (ZnSe) |
|  |  | Indium gallium nitride (InGaN) |

Figure 2A:
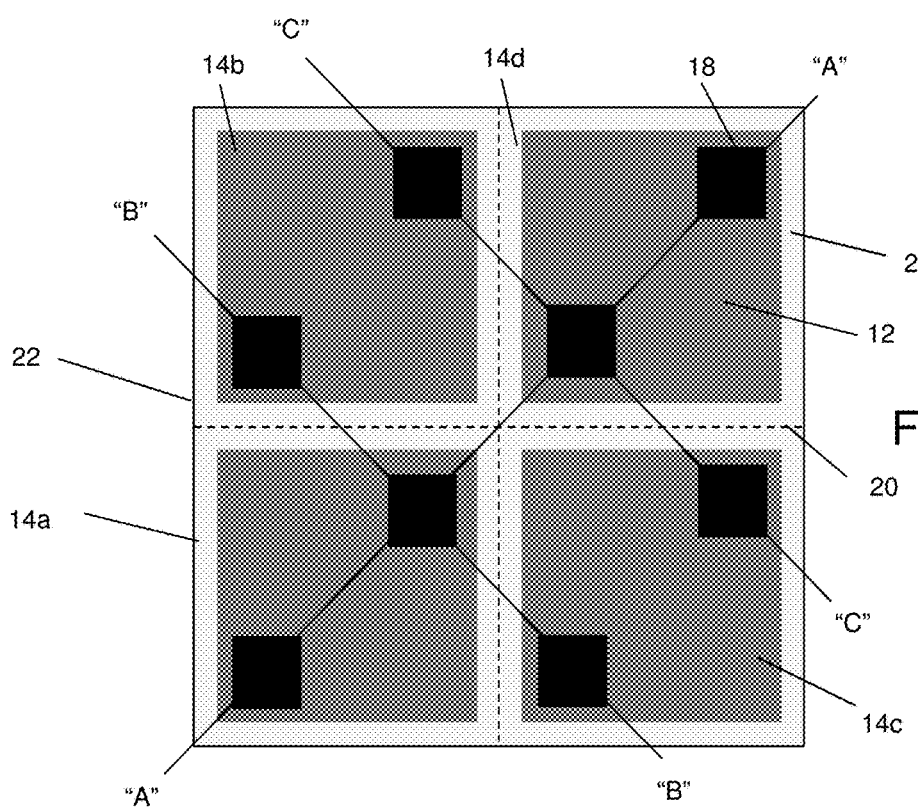
FIG. 2A shows a backside of the structure shown in FIG. 1 and respective fabrication processes in accordance with aspects of the present disclosure.

FIG. 2A shows a backside of the structure of FIG. 1 and respective fabrication processes in accordance with aspects of the present disclosure. As shown in FIG. 2A, the bond pad structures 18, e.g., interconnects, are located at two opposite corners of each sub-pixel 14a-14d. More specifically, in the embodiment shown in FIG. 2A, a bond pad structure 18 will be located on backside of the contact plate 12 at the lower left hand corner and at an upper right hand corner of each sub-pixel 14a-14d. This pattern can be repeated across an entire wafer for uniform pixel pitches. Moreover, each set of bond pad structures 18 will be bounded within the sub-pixel boundary 20 and the sub-pixels 14a-14d will be bounded by the pixel boundary 22.

In embodiments, the bond pad structures 18 will be sized based on an optimized ratio of bond pad material, e.g., copper, to insulator material, e.g., oxide material 24. By way of one example, the material of the bond pad structures 18, e.g., copper, for each sub-pixel 14a-14d would preferably be about or below 30% of the total surface area, thereby maximizing oxide to oxide bonding. Advantageously, although the surface area of the bond pad structures 18 has been doubled, e.g., two bond pad structures compared to a single bond pad structure in conventional designs, using this area ratio arrangement will thus ensure adequate oxide to oxide bonding between the ILED driver wafer and CMOS driver wafer.

The insulator material 24 can be any oxide material, e.g., $SiO_2$, formed by conventional deposition processes, e.g., chemical vapor deposition (CVD) processes, on the backside of the contact plate 12. The bond pad structures 18, e.g., interconnects, can be formed by conventional additive or subtractive processes. For example, in an additive process, the insulator material 24 will be deposited to a certain thickness, typically using a conventional chemical vapor deposition (CVD) process. Following the oxide deposition, a resist formed over the insulator material 24 is exposed to energy (light) to form a pattern (opening). An etching process with a selective chemistry, e.g., reactive ion etching (RIE), will be used to form one or more trenches in the insulator material 24 through the openings of the resist. The resist can then be removed by a conventional oxygen ashing process or other known stripants. Following the resist removal, conductive material, e.g., copper, can be deposited by any conventional deposition processes, e.g., CVD processes, to form the bond pad structures 18. Any residual material on the surface of the insulator material can be removed by conventional chemical mechanical polishing (CMP) processes.

Figure 2B:
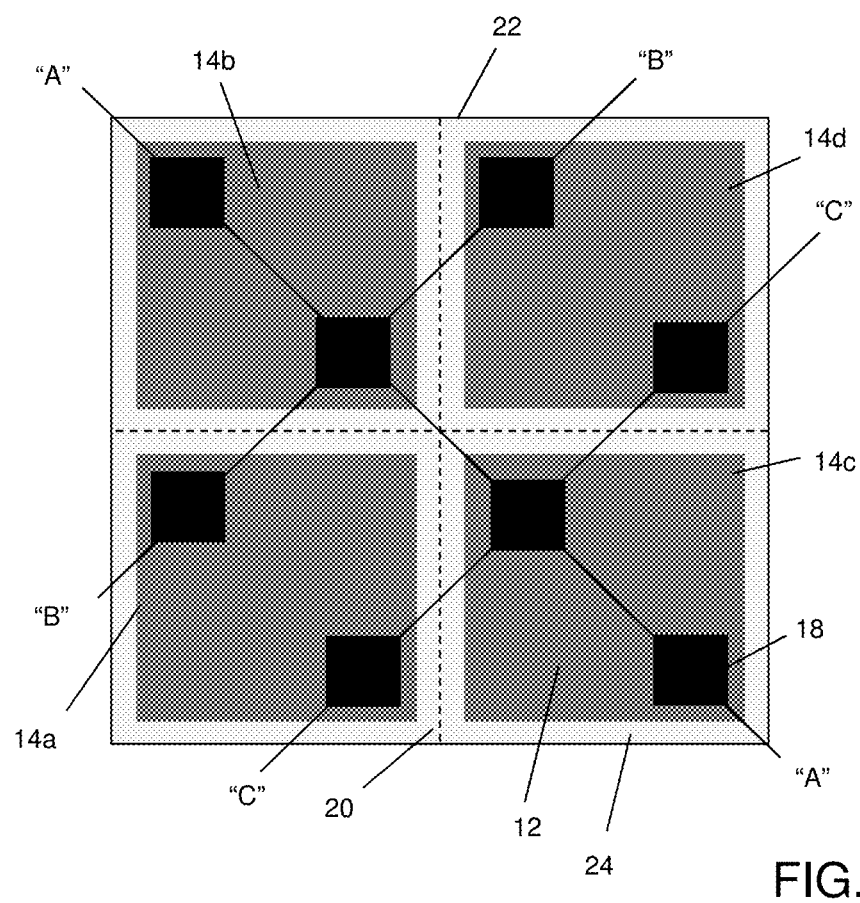
FIG. 2B shows an alternative backside of the structure shown in FIG. 1 and respective fabrication processes in accordance with aspects of the present disclosure.

FIG. 2B shows an alternative backside arrangement of the of bond pad structures 18 in accordance with aspects of the present disclosure. Similar to that described in FIG. 2A, as shown in FIG. 2B, the bond pad structures 18, e.g., interconnects, are located at two opposite corners of each sub-pixel 14a-14d. In this arrangement, though, a bond pad structure 18 will be located on a backside of the contact plate 12 in the upper left hand corner and lower right hand corner of each sub-pixel 14a-14d. Again, in this arrangement, the bond pad structures 18 can have a pitch which is maintained in all directions with redundancy in place. This pattern can also be repeated across an entire wafer for uniform pixel pitches. Moreover, each set of bond pad structures 18 will be bounded within the sub-pixel boundary 20 and the sub-pixels 14a-14d will be bounded by the pixel boundary 22.

In the arrangement shown in FIG. 2A and FIG. 2B, the bond pad structures 18 can have a pitch which is maintained in all directions with redundancy in place. Also, these layouts provide advantages over a single large pad pitch as such a large pad pitch does not provide any redundancy. Moreover, a redundancy scheme layout (e.g., more than two bond pad structures per sub pixel), has been found to result in too small of a pad pitch which, in turn, decreases yield bond. That is, using too small of a pad pitch will not be capable of maintaining high yield bonding. And, more than two connections can violate minimum pitch rules between sub-pixels.

Figure 3:
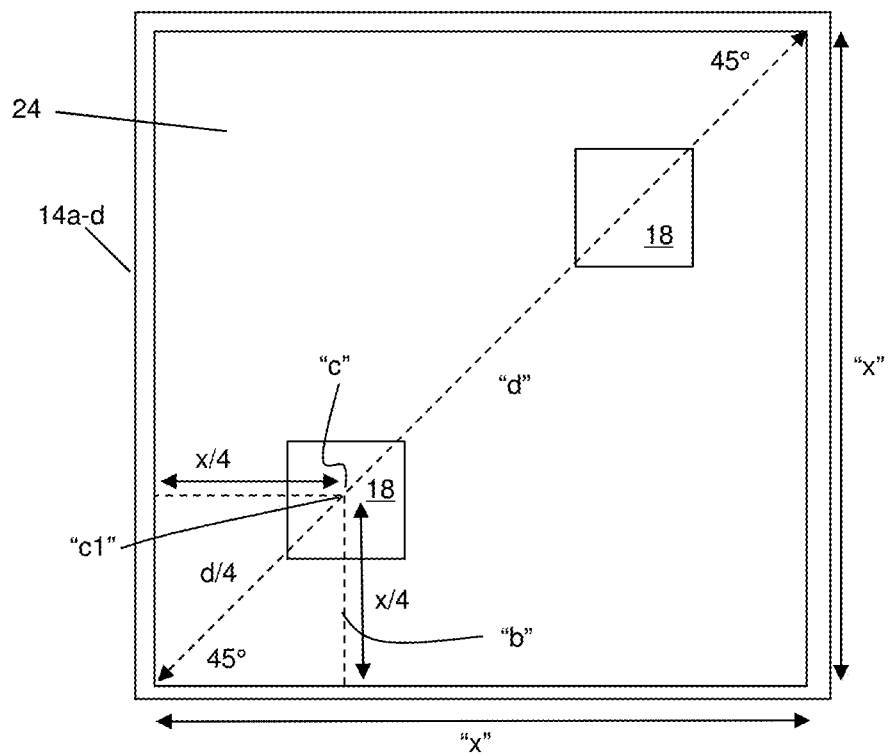
FIG. 3 shows an optimum bond pad placement in accordance with aspects of the present disclosure.

FIG. 3 shows an optimum bond pad placement in accordance with aspects of the present disclosure. More specifically, the placement of the bond pad structures 18, e.g., interconnects, can be defined by simple geometry rules for equal pitch from within and across sub-pixel diagonals. For example, as shown in FIG. 3, the bond pad structures 18 are provided at two opposing corners of each sub-pixel 14a-14d, intersecting a diagonal line "d" extending at 45° from opposing diagonal corners of the sub-pixel. Noting that each side of the sub-pixel has a length of "x", a center point "c" of each bond pad structure 18 will lie on a corner "c1" of an imaginary box "b" that has sides of length x/4 and a diagonal of length of d/4.

By placing the sub-pixel 14a-14d in the arrangement shown in FIG. 2A or FIG. 2B and FIG. 3, each of the bond pad structures 18 amongst each of the sub-pixel 14a-14d will be equally spaced apart along a respective diagonal. This diagonal line can be, e.g., lines "A", "B" or "C" shown in FIGS. 2A and 2B. And, by being equally spaced apart, the bond pad structures 18 will be spaced away from each other as far as possible. This arrangement will provide the necessary redundancy of the bond pad structures to maximize the contact area for connecting between an ILED driver wafer and the CMOS driver wafer, while maximizing high yielding bonds.

Figure 4:
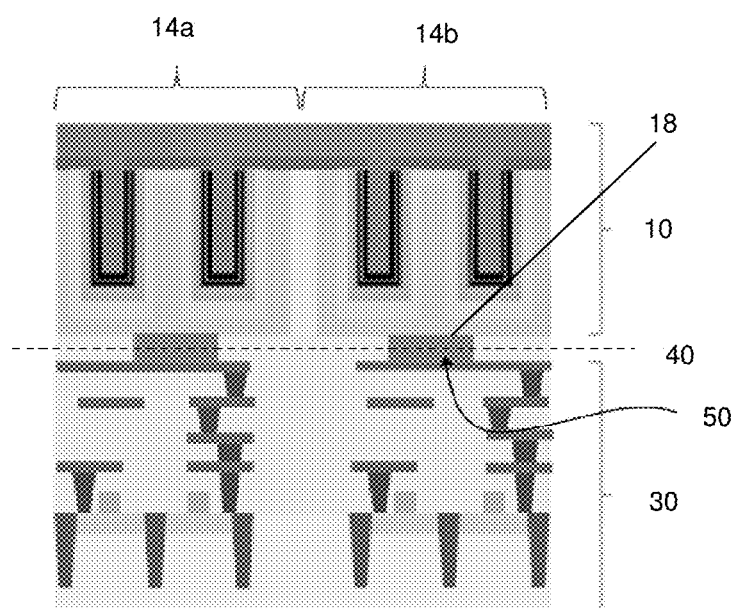
FIG. 4 shows wafer to wafer connection between an ILED driver wafer and a CMOS driver wafer in accordance with aspects of the present disclosure.

FIG. 4 shows wafer to wafer connection between an ILED driver wafer and a CMOS driver wafer in accordance with aspects of the present disclosure. More specifically, FIG. 4 shows the structure 10, e.g., an ILED driver wafer, bonded to a CMOS driver wafer 30 by an oxide to oxide bonding technique, shown as bond interface 40. The ILED driver wafer 10 is provided in cross sectional view with sub-pixels 14a-14b shown. The sub-pixels 14a-14b are connected to bond pads 50 of the CMOS driver wafer 30 by the bond pad structures 18.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising: a plurality of sub-pixels each comprising a contact plate; and redundant connections at opposite corners of each sub-pixel on a backside of the contact plate, wherein each side of the sub-pixel has a length of "x", a diagonal line "d" and a center point "c" of each bond pad structure on a backside of each sub-pixel lies on a corner "c1" of an imaginary box "b" that is located on opposing diagonal corners of the sub-pixel has sides of length x/4 and a diagonal of length of d/4 such that each bond pad structure will be equally spaced from each other along a diagonal of the sub-pixels.

2. The structure of claim 1, wherein the redundant connections are two bond pad structures per sub-pixel.

3. The structure of claim 2, wherein the redundant connections are repeated across an entire wafer for uniform pixel pitches.

4. The structure of claim 1, wherein the redundant connections include the bond pad structure located on the backside of the contact plate at a lower left hand corner and an upper right hand corner of each sub-pixel.

5. The structure of claim 1, wherein the redundant connections include the bond pad structure located on the backside of the contact plate at an upper left hand corner and a lower right hand corner of each sub-pixel.

6. The structure of claim 1, wherein the redundant connections are the bond pad structures provided at two opposing corners of each sub-pixel, intersecting a diagonal line "d" extending at 45° from opposing corners of the each sub-pixel.

7. The structure of claim 1, wherein each bond pad structure along a single diagonal line of multiple sub-pixels are equally spaced apart.

8. The structure of claim 1, further comprising oxide material on the backside of the contact plate, wherein a surface area of the bond pad structures is about 30% or less of a total surface area of the backside of the contact plate.

9. A structure, comprising: a plurality of sub-pixels each comprising a contact plate; redundant connections at opposite corners of each sub-pixel on a backside of the contact plate; and oxide material on the backside of the contact plate, wherein a surface area of the bond pad structures is about 30% or less of a total surface area of the backside of the contact plate, wherein each side of the sub-pixel has a length of "x", a diagonal line "d" and a center point "c" of each bond pad structure lies on a corner "c1" of an imaginary box "b" that has sides of length x/4 and a diagonal of length of d/4, and wherein the plurality of sub-pixels form a pixel of an ILED driver wafer, the ILED driver wafer is bonded to a CMOS driver wafer by an oxide to oxide bond with oxide material of the CMOS driver wafer and the oxide material.

10. A pixel structure, comprising:
   a plurality of sub-pixels each comprising a contact plate;
   bond pad structures at two opposing corners on a backside of the contact plate and which intersect a diagonal line "d" extending between the two opposing corners of each sub-pixel; and
   an oxide material on the backside of the contact plate, wherein:
   a surface area of the bond pad structures is about 30% or less of a total surface area of the backside of the contact plate, and
   the plurality of sub-pixels form a pixel of an ILED driver wafer, the ILED driver wafer is bonded to a CMOS driver wafer by an oxide to oxide bond with oxide material of the CMOS driver wafer and the oxide material.

11. The pixel structure of claim 10, wherein a first of the bond pad structures is located on the backside of the contact plate at a lower left hand corner of each sub-pixel and a second of the bond pad structures is located at an upper right hand corner of each sub-pixel.

12. The pixel structure of claim 10, wherein a first of the bond pad structures is located on the backside of the contact plate at an upper left hand corner of each sub-pixel and a second of the bond pad structures is located at a lower right hand corner of each sub-pixel.

13. The pixel structure of claim 10, wherein the diagonal line "d" extends at 45° from opposing corners of the each sub-pixel.

14. The pixel structure of claim 13, wherein each side of the sub-pixel has a length of "x", and a center point "c" of each bond pad structure lies on a corner "c1" of an imaginary box "b" that has sides of length x/4 and a diagonal of length of d/4.

15. The pixel structure of claim 14, wherein each bond pad structure located along a single diagonal line of multiple sub-pixels are equally spaced apart.

16. A method comprising forming bond pad structures at two opposing corners on a backside of a contact plate of a plurality of sub-pixels, the bond pad structures intersecting a diagonal line "d" extending between the two opposing corners of each sub-pixel, forming an oxide material on the backside of the contact plate, and the plurality of sub-pixels form a pixel of an ILED driver wafer which is bonded to a CMOS driver wafer by an oxide to oxide bond with oxide material of the CMOS driver wafer and the oxide material on the backside of the contact plate.

17. The method of claim 16, wherein a surface area of the bond pad structures is about 30% or less of a total surface area of the backside of the contact plate.

18. The method of claim 16, wherein each side of the sub-pixel has a length of "x", and a center point "c" of each bond pad structure lies on a corner "c1" of an imaginary box "b" that has sides of length x/4 and a diagonal of length of d/4.

19. The method of claim 18, wherein each bond pad structure along a single diagonal line of multiple sub-pixels are equally spaced apart.

20. The structure of claim 16, wherein a surface area of the bond pad structures is about 30% or less of a total surface area of the backside of the contact plate.

* * * * *